United States Patent
Sugimoto et al.

(10) Patent No.: US 10,068,972 B2
(45) Date of Patent: Sep. 4, 2018

(54) SEMICONDUCTOR DEVICE WITH OPPOSITE CONDUCTIVITY-TYPE IMPURITY REGIONS BETWEEN SOURCE AND TRENCH GATE FOR REDUCING LEAKAGE

(71) Applicant: Toyota Jidosha Kabushiki Kaisha, Toyota-shi Aichi-ken (JP)

(72) Inventors: Masahiro Sugimoto, Toyota (JP); Sachiko Aoi, Nagakute (JP); Shoji Mizuno, Kariya (JP); Shinichiro Miyahara, Kariya (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 15/157,865

(22) Filed: May 18, 2016

(65) Prior Publication Data
US 2016/0351665 A1    Dec. 1, 2016

(30) Foreign Application Priority Data
May 27, 2015    (JP) .................................. 2015-107287

(51) Int. Cl.
*H01L 29/78*    (2006.01)
*H01L 29/10*    (2006.01)
(Continued)

(52) U.S. Cl.
CPC .... *H01L 29/1083* (2013.01); *H01L 29/42368* (2013.01); *H01L 29/7811* (2013.01);
(Continued)

(58) Field of Classification Search
CPC ............. H01L 29/1083; H01L 29/1095; H01L 29/1608; H01L 29/7813; H01L 29/66325;
(Continued)

(56) References Cited

U.S. PATENT DOCUMENTS 5,554,862 A * 9/1996 Omura .................. H01L 29/749
257/133
5,689,121 A * 11/1997 Kitagawa ............ H01L 29/7455
257/135

(Continued)

FOREIGN PATENT DOCUMENTS

JP    2013-012647 A    1/2013
WO    2013/118203 A1    8/2013
WO    2013/118437 A1    8/2013

*Primary Examiner* — Meiya Li
*Assistant Examiner* — Shih Tsun A Chou
(74) *Attorney, Agent, or Firm* — Dinsmore & Shohl LLP (57) ABSTRACT

A semiconductor device is provided with a semiconductor substrate and a trench gate. The semiconductor substrate is provided with a drift region of a first conductive type, wherein the drift region is in contact with the trench gate; a body region of a second conductive type, wherein the body region is disposed above the drift region and is in contact with the trench gate; a source region of the first conductive type, wherein the source region is disposed above the body region, exposed on the front surface of the semiconductor substrate and is in contact with the trench gate; and a front surface region of the second conductive type, wherein the front surface region is disposed above the source region, exposed on the front surface of the semiconductor substrate and is in contact with the trench gate.

8 Claims, 5 Drawing Sheets

(51) Int. Cl.
  *H01L 29/423* (2006.01)
  *H01L 29/16* (2006.01)
(52) U.S. Cl.
  CPC ...... *H01L 29/7813* (2013.01); *H01L 29/1095* (2013.01); *H01L 29/1608* (2013.01)
(58) Field of Classification Search
  CPC ............. H01L 29/7393; H01L 29/7395; H01L 29/7397; H01L 29/4236
  See application file for complete search history.

(56) References Cited

U.S. PATENT DOCUMENTS

| | | | | |
|---|---|---|---|---|
| 5,689,128 A * | 11/1997 | Hshieh | H01L 29/0878 | 257/329 |
| 6,674,124 B2 * | 1/2004 | Hshieh | H01L 21/28185 | 257/330 |
| 6,717,200 B1 * | 4/2004 | Schamberger | H01L 29/66666 | 257/302 |
| 6,809,375 B2 * | 10/2004 | Takemori | H01L 29/7397 | 257/329 |
| 7,084,456 B2 * | 8/2006 | Williams | H01L 29/66734 | 257/257 |
| 8,836,015 B2 * | 9/2014 | Bhalla | H01L 29/66712 | 257/328 |
| 9,099,521 B2 * | 8/2015 | Yamashita | H01L 29/7395 | |
| 9,209,294 B1 * | 12/2015 | Kiyosawa | H01L 29/6606 | |
| 9,306,047 B2 * | 4/2016 | Hashimoto | H01L 29/7397 | |
| 2005/0167742 A1 * | 8/2005 | Challa | H01L 21/3065 | 257/328 |
| 2005/0215012 A1 * | 9/2005 | Williams | H01L 29/0878 | 438/270 |
| 2006/0081919 A1 * | 4/2006 | Inoue | H01L 29/0696 | 257/330 |
| 2006/0113588 A1 * | 6/2006 | Wu | H01L 29/66719 | 257/330 |
| 2008/0277695 A1 * | 11/2008 | Li | H01L 27/0727 | 257/262 |
| 2009/0078995 A1 * | 3/2009 | Nakagawa | H01L 29/7813 | 257/330 |
| 2011/0220991 A1 * | 9/2011 | Takaya | H01L 29/0623 | 257/330 |
| 2012/0007241 A1 * | 1/2012 | Mizuno | H01L 29/0619 | 257/751 |
| 2012/0074489 A1 * | 3/2012 | Hsieh | H01L 29/7813 | 257/330 |
| 2013/0001679 A1 * | 1/2013 | Omori | H01L 21/76897 | 257/330 |
| 2013/0200451 A1 * | 8/2013 | Yilmaz | H01L 29/4236 | 257/331 |
| 2013/0341643 A1 * | 12/2013 | Kudou | H01L 29/66068 | 257/77 |
| 2014/0077253 A1 * | 3/2014 | Soeno | H01L 29/32 | 257/139 |
| 2015/0129895 A1 * | 5/2015 | Takeuchi | H01L 29/4236 | 257/77 |
| 2015/0295028 A1 * | 10/2015 | Kagata | H01L 29/861 | 257/330 |
| 2015/0333175 A1 | 11/2015 | Kiyosawa et al. | | |

* cited by examiner

SEMICONDUCTOR DEVICE WITH OPPOSITE CONDUCTIVITY-TYPE IMPURITY REGIONS BETWEEN SOURCE AND TRENCH GATE FOR REDUCING LEAKAGE

CROSS-REFERENCE TO RELATED APPLICATION

This application claims priority to Japanese Patent Application No. 2015-107287 filed on May 27, 2015, the entire contents of which are hereby incorporated by reference into the present application.

TECHNICAL FIELD

A technique disclosed herein relates to a semiconductor device comprising a trench gate.

DESCRIPTION OF RELATED ART

Japanese Patent Application Publication No. 2013-12647 A discloses a semiconductor device including a trench gate. The trench gate extends from a front surface of a semiconductor substrate toward a deep portion of the semiconductor substrate. It is known that an electric field concentrates on a part of a side surface of the trench gate that is located near the front surface of the semiconductor substrate. For this reason, electrons that are implanted from an n-type source region provided in this part may leak to a gate electrode beyond a gate insulation film. Japanese Patent Application Publication No. 2013-12647 A discloses a technique of selectively thickening a part of the gate insulation film that is located near the front surface of the semiconductor substrate. When the part of the gate insulation film that is located near the front surface of the semiconductor substrate has been selectively made thicker, the leakage at this part is suppressed.

SUMMARY

However, it is difficult to make a thick gate insulation film of high quality. It is an object of the present teachings to provide a technique of suppressing leakage in a part of a side surface of a trench gate that is located near a front surface of a semiconductor substrate.

In one aspect of the present teachings, a semiconductor device disclosed herein comprises a semiconductor substrate and a trench gate extending from a front surface of the semiconductor substrate toward a deep portion of the semiconductor substrate. The semiconductor substrate comprises a drift region of a first conductive type, a body region of a second conductive type, a source region of the first conductive type and a front surface region of the second conductive type. The drift region is in contact with the trench gate. The body region is disposed above the drift region and is in contact with the trench gate. The source region is disposed above the body region, exposed on the front surface of the semiconductor substrate and is in contact with the trench gate. The front surface region is disposed above the source region, exposed on the front surface of the semiconductor substrate and is in contact with the trench gate.

The front surface region of the semiconductor device according to the above aspect is disposed in a part of a side surface of the trench gate that is located near the front surface of the semiconductor substrate and is of the opposite conductivity type to the source region. As such, the front surface region can prevent carriers that are implanted from the source region from leaking to a gate electrode beyond a gate insulation film. In the semiconductor device according to the aspect, the leakage in the part of the side surface of the trench gate that is located near the front surface of the semiconductor substrate is suppressed.

DETAILED DESCRIPTION

Figure 1:
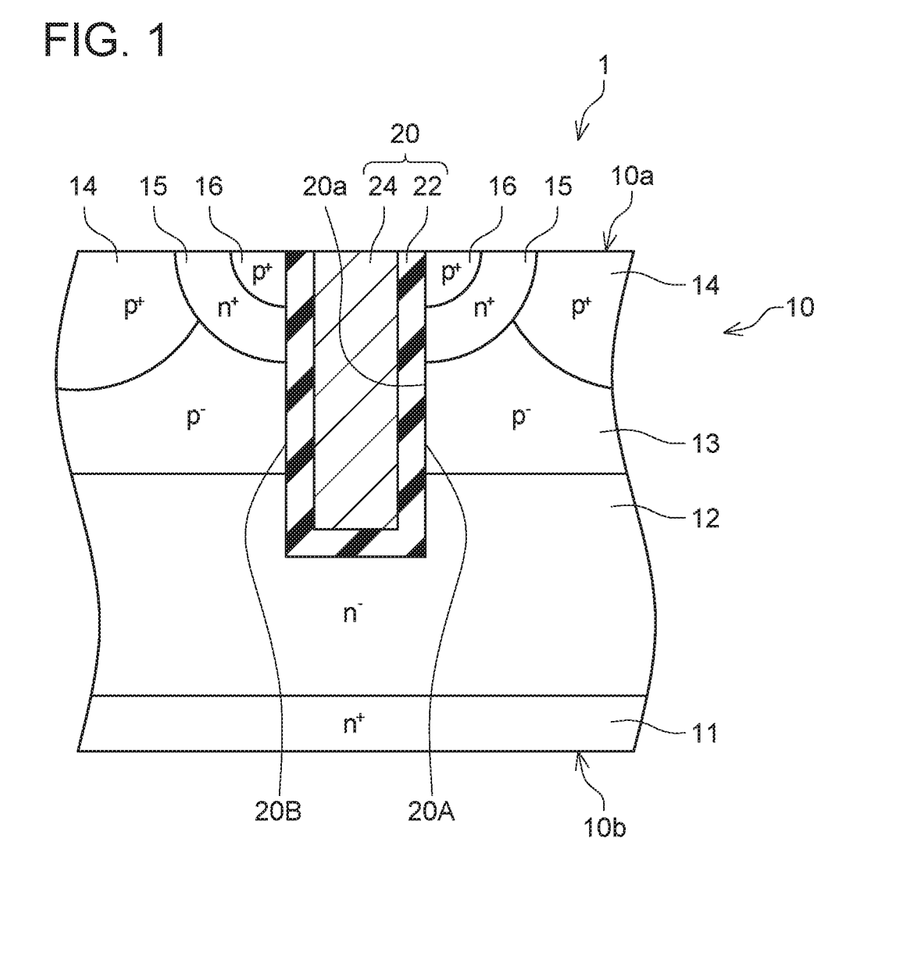
FIG. 1 is a cross-sectional view schematically showing main components of a semiconductor device according to an embodiment as taken along line I-I in FIG. 3.

As shown in FIG. 1, a semiconductor device 1 is a power semiconductor element called a MOSFET (Metal-Oxide-Semiconductor Field-Effect Transistor). The semiconductor device 1 comprises a semiconductor substrate 10 and a trench gate 20.

The semiconductor substrate 10 is a substrate made of silicon carbide (SiC). The semiconductor substrate 10 comprises an $n^+$-type drain region 11, an $n^-$-type drift region 12, a $p^-$-type body region 13, a $p^+$-type body contact region 14, an $n^+$-type source region 15, and a $p^+$-type front surface region 16. As shown in FIG. 1, the impurity concentration of the front surface region 16 is higher than the impurity concentration of the body region 13.

The drain region 11 is disposed in a back layer portion of the semiconductor substrate 10 and exposed on a back surface 10b of the semiconductor substrate 10. The drain region 11 is also a foundation substrate on which the drift region 12, which will be described below, epitaxially grows. The drain region 11 is in ohmic contact with a drain electrode (not illustrated) covering the back surface 10b of the semiconductor substrate 10. In one example, it is desirable that the drain region 11 have an impurity concentration of more than approximately $1 \times 10^{19}$ $cm^{-3}$.

The drift region 12 is provided above the drain region 11. The drift region 12 is formed by crystal-growing from a front surface of the drain region 11 through an epitaxial growth technique. The drift region 12 has an impurity concentration that is constant along a thickness direction of the semiconductor substrate 10. In one example, it is desirable that the drift region 12 have an impurity concentration of approximately $1 \times 10^{15}$ to $5 \times 10^{16}$ $cm^{-3}$.

The body region 13 is provided above the drift region 12 and disposed in a front layer portion of the semiconductor substrate 10. The body region 13 is formed by introducing aluminum into the front layer portion of the semiconductor substrate 10 through an ion implantation technique. In one example, it is desirable that the body region 13 have a dose amount of approximately $1 \times 10^{11}$ to $1 \times 10^{13}$ $cm^{-2}$ and a peak concentration of approximately $1 \times 10^{16}$ to $1 \times 10^{18}$ $cm^{-3}$. Alternatively, the body region 13 may be formed by crystal-growing from a front surface of the drift region 12 through the epitaxial growth technique.

The body contact region 14 is provided above the body region 13, disposed in the front layer portion of the semiconductor substrate 10, and exposed on a front surface 10a of the semiconductor substrate 10. The body contact region 14 is formed by introducing aluminum into the front layer portion of the semiconductor substrate 10 through the ion implantation technique. The body contact region 14 is in ohmic contact with a source electrode (not illustrated) covering the front surface 10a of the semiconductor substrate 10. In one example, it is desirable that the body contact region 14 have a dose amount of approximately $1 \times 10^{14}$ to $1 \times 10^{15}$ cm$^{-2}$ and a peak concentration of approximately $1 \times 10^{19}$ to $2 \times 10^{20}$ cm$^{-3}$. It should be noted that the body contact region 14 may be formed in the same step as the front surface region 16, which will be described below. This reduces a number of manufacturing steps, thus reducing manufacturing costs. Further, when formed in the same step as the front surface region 16, the body contact region 14 has the same depth as the front surface region 16.

The source region 15 is provided above the body region 13, disposed in the front layer portion of the semiconductor substrate 10, and exposed on the front surface 10a of the semiconductor substrate 10. The source region 15 is separated from the drift region 12 by the body region 13. The source region 15 is formed by introducing nitrogen or phosphorus into the front layer portion of the semiconductor substrate 10 through the ion implantation technique. The source region 15 is in ohmic contact with the source electrode (not illustrated) covering the front surface 10a of the semiconductor substrate 10. In one example, it is desirable that the source region 15 have a dose amount of approximately $1 \times 10^{14}$ to $5 \times 10^{15}$ cm$^{-2}$ and a peak concentration of approximately $1 \times 10^{19}$ to $5 \times 10^{20}$ cm$^{-3}$.

The front surface region 16 is provided above the source region 15, disposed in the front layer portion of the semiconductor substrate 10, and exposed on the front surface 10a of the semiconductor substrate 10. The front surface region 16 is formed by introducing aluminum into the front layer portion of the semiconductor substrate 10 through the ion implantation technique. The front surface region 16 is in ohmic contact with the source electrode (not illustrated) covering the front surface 10a of the semiconductor substrate 10. In one example, it is desirable that the front surface region 16 have a dose amount of approximately $1 \times 10^{14}$ to $5 \times 10^{15}$ cm$^{-2}$ and a peak concentration of approximately $1 \times 10^{19}$ to $5 \times 10^{20}$ cm$^{-3}$.

The trench gate 20 is provided in a trench 20a extending from the front surface 10a of the semiconductor substrate 10 toward a deep portion of the semiconductor substrate 10. The trench gate 20 includes a gate insulation film 22 and a gate electrode 24. The trench gate 20 penetrates the front surface region 16, the source region 15, and the body region 13 and reaches the drift region 12. The front surface region 16, the source region 15, and the body region 13 are in contact with a side surface of the trench gate 20, and the drift region 12 is in contact with the side surface and a bottom surface of the trench gate 20. The gate insulation film 22 is provided on an inner wall of the trench 20a and made of silicon oxide. The gate insulation film 22 is deposited on the inner wall of the trench 20a through a CVD technique. The gate electrode 24 is at least partially surrounded, e.g. on the sides and edges, with the gate insulation film 22 and made of polysilicon containing impurities. The gate electrode 24 is filled in the trench 20a through the CVD technique after the formation of the gate insulation film 22 on the inner wall of the trench 20a.

Figure 2:
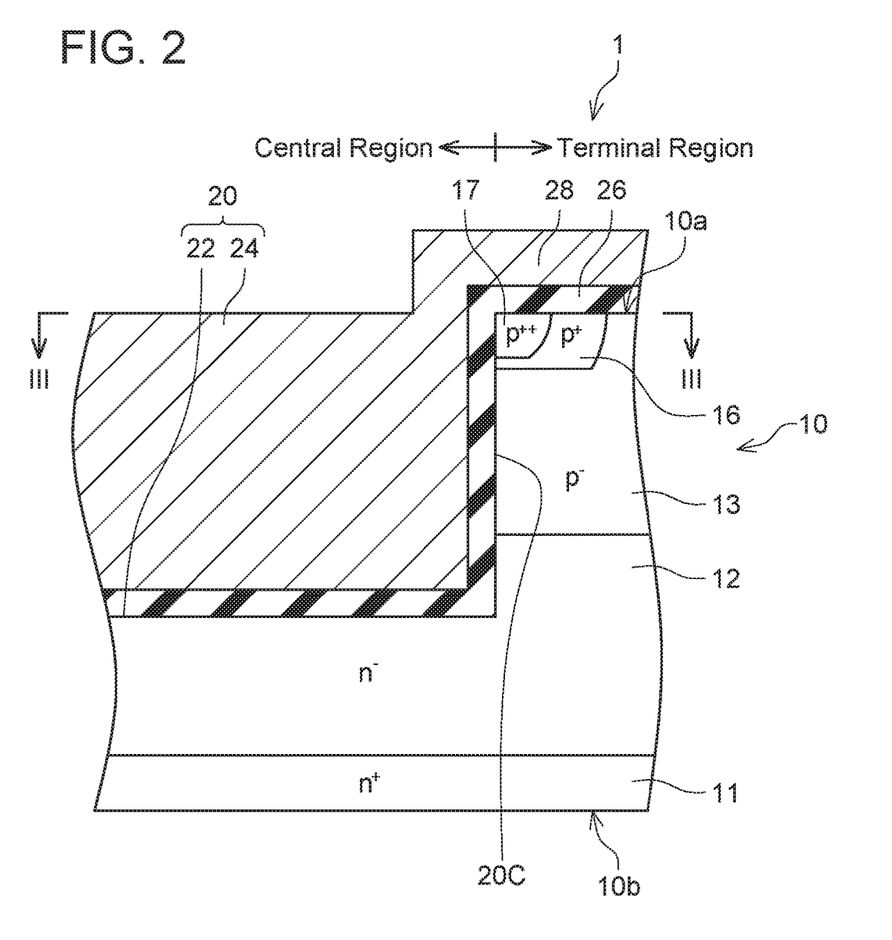
FIG. 2 is a cross-sectional view schematically showing the main components of the semiconductor device according to the embodiment as taken along line II-II in FIG. 3.
Figure 3:
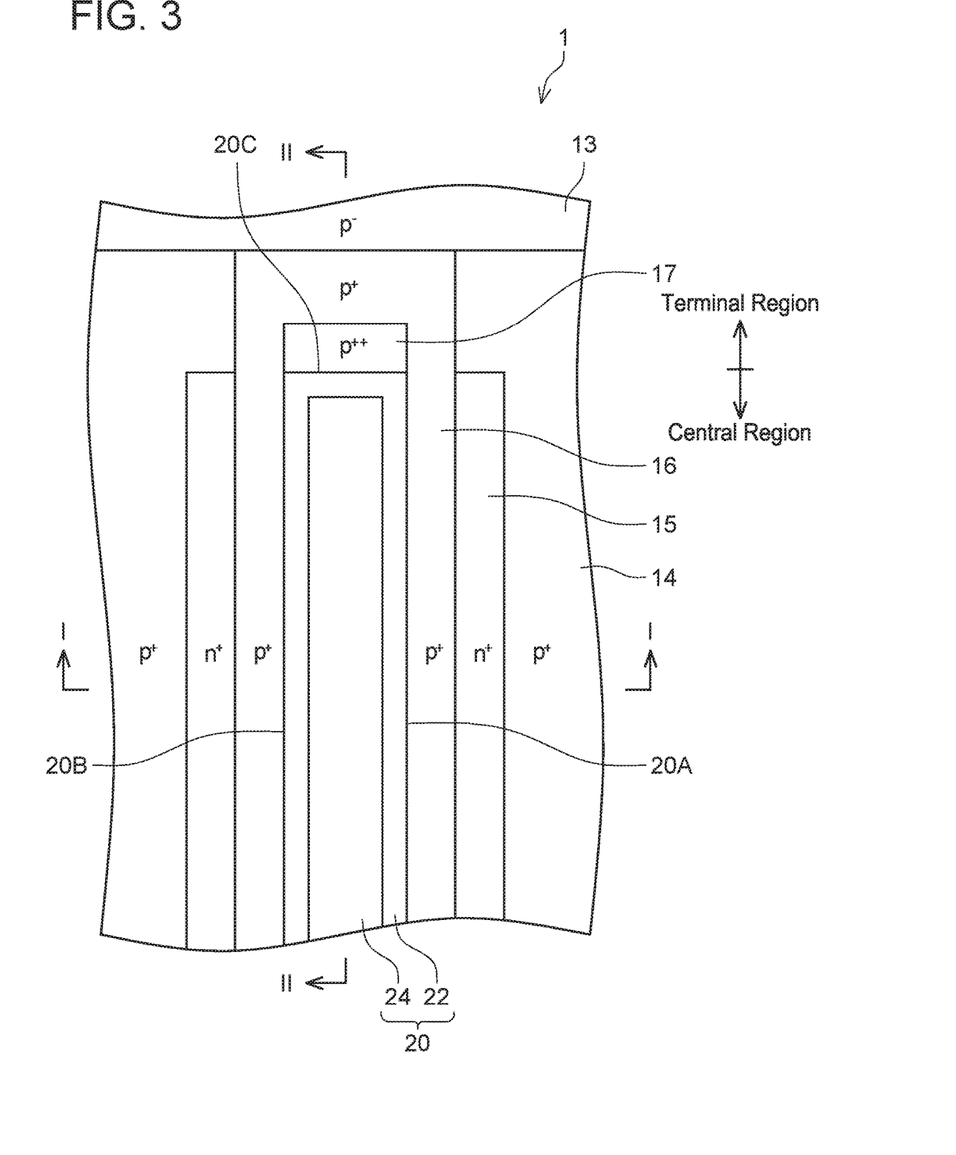
FIG. 3 is a cross-sectional view schematically showing the main components of the semiconductor device according to the embodiment as taken along line III-III in FIG. 2.

As shown in FIGS. 2 and 3, the semiconductor substrate 10 is partitioned into a central region in which the trench gate 20 is provided and a terminal region surrounding the central region. It should be noted that although this example illustrates a single trench gate 20, a plurality of the trench gates 20 is provided in the central region of the semiconductor substrate 10. In a view along a direction orthogonal to the front surface 10a of the semiconductor substrate 10, the plurality of trench gates 20 is arranged in stripes.

As shown in FIG. 3, the trench gate 20 includes a pair of side surfaces 20A and 20B that are parallel to a longitudinal direction of the trench gate 20 (i.e., a vertical direction in the figure) and an edge side surface 20C extending between the pair of the side surfaces 20A and 20B. The source region 15 and the front surface region 16 are provided in contact with the pair of the side surfaces 20A and 20B of the trench gate 20 in an entire area of the pair in the longitudinal direction, i.e., along its entire length of the pair in the longitudinal direction. Alternatively, the source region 15 and the front surface region 16 may be provided in contact with the pair of the side surfaces 20A and 20B of the trench gate 20 in a part of the entire area of the pair in the longitudinal direction, i.e., along a part of the entire length of the pair in the longitudinal direction. The front surface region 16 further surrounds an edge of the trench gate 20 and, as shown in FIG. 2, is in contact with the edge side surface 20C of the trench gate 20. Further, as shown in FIG. 3, the front surface region 16 is in contact with the body contact region 14 in the terminal region.

As shown in FIG. 2, the front surface 10a of the semiconductor substrate 10 in the terminal region is provided with a gate wiring 28 with an interlayer insulation film 26 therebetween. The gate wiring 28 is arranged along the terminal region to a gate pad (not illustrated). The gate electrode 24 is connected to the gate wiring 28 at the edge of the trench gate 20 in the longitudinal direction.

As shown in FIGS. 2 and 3, the semiconductor substrate 10 further includes a p$^{++}$ type high concentration front surface region 17 provided near the edge of the trench gate 20 in the longitudinal direction. The high concentration front surface region 17 is provided above the front surface region 16, disposed in the front layer portion of the semiconductor substrate 10, and exposed on the front surface 10a of the semiconductor substrate 10. The high concentration front surface region 17 is in contact with the edge surface 20C of the trench gate 20. An impurity concentration of the high concentration front surface region 17 is higher than the impurity concentration of the front surface region 16. The high concentration front surface region 17 is formed by introducing aluminum into the front layer portion of the semiconductor substrate 10 through the ion implantation technique. In one example, it is desirable that the high concentration front surface region 17 have a dose amount of approximately $1 \times 10^{13}$ to $1 \times 10^{15}$ cm$^{-2}$ and a peak concentration of approximately $1 \times 10^{18}$ to $2 \times 10^{20}$ cm$^{-3}$.

Next, operation of the semiconductor device 1 will be described with reference to FIG. 1. The semiconductor device 1 is off when a positive voltage is applied to the drain electrode (not illustrated) connected to the drain region 11, the source electrode (not illustrated) connected to the body contact region 14 and the source region 15 is grounded, and the gate electrode 24 of the trench gate 24 is grounded. When a positive voltage is applied to the drain electrode (not illustrated) connected to the drain region 11, the source electrode (not illustrated) connected to the body contact region 14 and the source region 15 is grounded, and a voltage that is more positive than that applied to the source electrode (not illustrated) is applied to the gate electrode 24 of the trench gate 20, the semiconductor device 1 is then turned as an inversion layer is formed in a part of the side surface of the trench gate 20 that is in contact with the body region 13 separating the source region 15 from the drift region 12, and a current flows through the inversion layer.

The application of a positive voltage to the gate electrode 24 of the trench gate 20 causes an electric field to concentrate on a part of the pair of the side surfaces 20A and 20B of the trench gate 20 that is located near the front surface 10a of the semiconductor substrate 10. In the semiconductor device 1, the front surface region 16 is provided in correspondence with this part. The front surface region 16 is configured as being of the opposite conductivity type to the source region 15. For this reason, in this place on which the electric field concentrates, the front surface region 16 can prevent electrons that are implanted from the source region 15 from flowing to the gate electrode 24 beyond the gate insulation film 22.

Furthermore, as shown in FIG. 2, in the semiconductor device 1, the front surface region 16 and the high concentration front surface region 17 are provided in contact with the edge side surface 20C of the trench gate 20. This is a part on which an electric field particularly concentrates due to the positive voltage that is applied to the gate electrode 24 of the trench gate 20 and a positive voltage that is applied to the gate wiring 28. In this place in the semiconductor device 1 on which the electric field particularly concentrates, the source region 15 is not provided, but the front surface region 16 and the high concentration front surface region 17 are provided. For this reason, in the semiconductor device 1, the leakage in this place on which the electric filed particularly concentrates is suppressed as well.

Further, the semiconductor substrate 10 of the semiconductor device 1 is made of silicon carbide. In the semiconductor device 1 comprising the semiconductor substrate 10 made of silicon carbide, the gate insulation film 22 of the trench gate 20 is low in quality. Reasons of this are because a comparison of theoretical values shows that a barrier ($\varphi B$) between silicon carbide and silicon oxide is lower than a barrier ($\varphi B$) between silicon and silicon oxide, and further because of an effect brought forth by shapes (concentration of an electric field on a trench protrusion). However, in the semiconductor device 1, the leakage can be suppressed even with such a low-quality gate insulation film 22, as the front surface region 16 and the high concentration front surface region 17 are provided. Thus, the technique of providing the front surface region 16 and the high concentration front surface region 17 is useful particularly in a case where the semiconductor substrate 10 is made of silicon carbide.

Further, the semiconductor device 1 is configured such that the front surface region 16 makes contact with the body contact region 14 in the terminal region. The front surface region 16 is configured to have a narrower width than the source region 15 and may have difficulty in making direct contact with the source electrode (not illustrated) covering the front surface 10a of the semiconductor substrate 10. Even in such a case, the semiconductor device 1 is configured such that the front surface 16 and the source electrode (not illustrated) can be electrically connected to each other via the body contact region 14.

Figure 4:
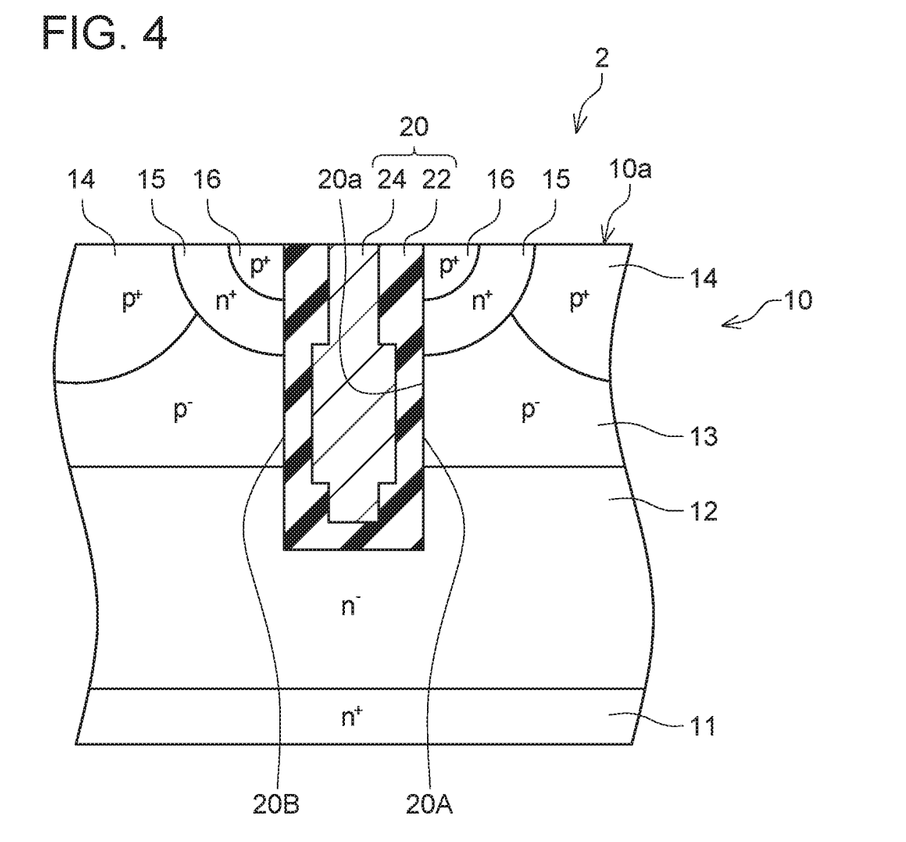
FIG. 4 is a cross-sectional view schematically showing main components of a semiconductor device according to a modification.

FIG. 4 shows a semiconductor device 2 according to a modification. The semiconductor device 2 is configured such that a part of the gate insulation film 22 of the trench gate 20 that is in contact with the front surface region 16 and the source region 15 is thicker than a part of the gate insulation film 22 of the trench gate 20 that is in contact with the body region 13. Furthermore, the semiconductor device 2 is configured such that a part of the gate insulation film 22 of the trench gate 20 that is in contact with the drift region 12 is thicker than the part of the gate insulation film 22 of the trench gate 20 that is in contact with the body region 13. Since the part of the gate insulation film 22 that is in contact with the front surface region 16 and the source region 15 is thick, leakage in this part is further suppressed. Since the part of the gate insulation film 22 that is in contact with the drift region 12 is thick, leakage in this part is further suppressed. Moreover, since the part of the gate insulation film 22 of the trench gate 20 that is in contact with the body region 13 is thin, an increase in threshold voltage is suppressed.

Figure 5:
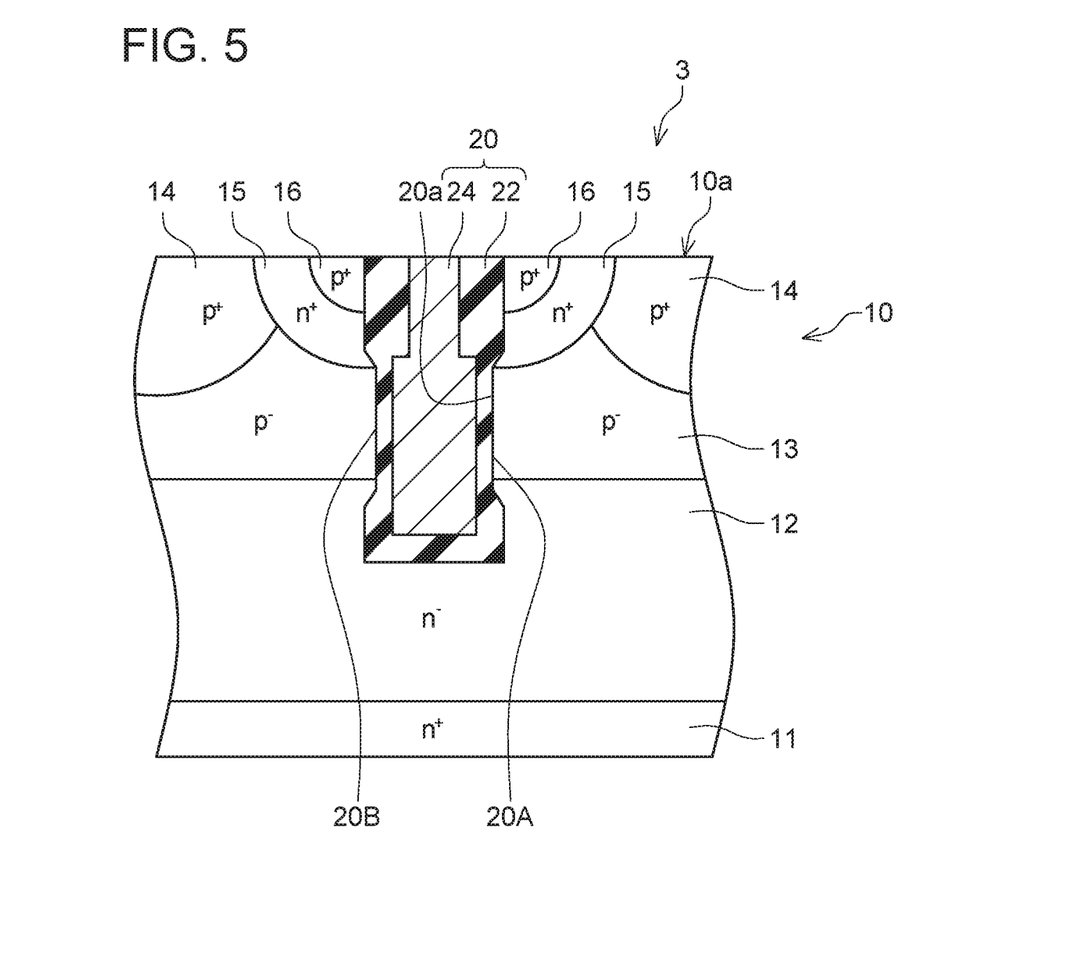
FIG. 5 is a cross-sectional view schematically showing main components of a semiconductor device according to a modification.

As for the thickness of the gate insulation film 22, a depression may be provided in an inner surface side of the gate insulation film 22 as in the semiconductor device 2 shown in FIG. 4, or depressions may be provided both in inner and outer surface sides of the gate insulation film 22 as in a semiconductor device 3 shown in FIG. 5.

Some of the features characteristic to above-described embodiments will herein be listed. It should be noted that the respective technical elements are independent of one another, and are useful solely or in combinations. The combinations thereof are not limited to those described in the claims as originally filed.

In one aspect of the present teachings, a semiconductor device disclosed herein may be MOSFET (Metal Oxide Semiconductor Field Effect Transistor) or IGBT (Insulated Gate Bipolar Transistor). One embodiment of these semiconductor devices may comprise a semiconductor substrate and a trench gate extending from a front surface of the semiconductor substrate toward a deep portion of the semiconductor substrate. One embodiment of these semiconductor devices is typically a vertical type semiconductor device and may comprise a pair of main electrodes disposed on a front surface and a back surface of the semiconductor substrate respectively. A material of the semiconductor substrate is not limited to a specific one, however, the technique disclosed herein is particularly useful when the material of the semiconductor substrate is silicon carbide as discussed herein. The semiconductor substrate may comprise a drift region of a first conductive type, a body region of a second conductive type, a source region of the first conductive type and a front surface region of the second conductive type. The drift region is in contact with the trench gate. The body region is disposed above the drift region and is in contact with the trench gate. The source region is disposed above the body region, exposed on the front surface of the semiconductor substrate and is in contact with the trench gate. The front surface region is disposed above the source region, exposed on the front surface of the semiconductor substrate and is in contact with the trench gate.

In a view along a direction orthogonal to the front surface of the semiconductor substrate, the front surface region may be in contact with a side surface of the trench gate that is parallel to a longitudinal direction of the trench gate. It is desirable that the front surface region be in contact with the side surface of the trench gate in an entire area of the side surface of the trench gate in the longitudinal direction, i.e., along an entire length of the side surface of the trench gate in the longitudinal direction. In the semiconductor device according to this embodiment, leakage on the side surface of the trench gate that is parallel to the longitudinal direction of the trench gate is suppressed.

In the view along the direction orthogonal to the front surface of the semiconductor substrate, the front surface region may further surround an edge of the trench gate in the longitudinal direction. In the semiconductor device according to this embodiment, leakage at the edge of the trench gate in the longitudinal direction is suppressed.

The above embodiment of the semiconductor device may further comprise a high concentration front surface region of the second conductive type. The high concentration front surface region is exposed on the front surface of the semiconductor substrate and an impurity concentration of the high concentration front surface region is higher than an impurity concentration of the front surface region. In the view along the direction orthogonal to the front surface of the semiconductor substrate, the high concentration front surface region is in contact with an edge side surface of the trench gate that connects between a pair of side surfaces of the trench gate at the edge of the trench gate in the longitudinal direction, wherein the pair of side surfaces is parallel to the longitudinal direction of the trench gate. In the semiconductor device according to this embodiment, leakage on the edge side surface of the trench gate in the longitudinal direction is suppressed.

The trench gate may comprise a gate insulation film and a gate electrode at least partially surrounded with the gate insulation film. A part of the gate insulation film that is in contact with the front surface region and the source region is thicker than a part of the gate insulation film that is in contact with the body region. In the semiconductor device according to this embodiment, leakage in a part of the side surface of the trench gate that is located near the front surface of the semiconductor substrate is further suppressed.

A material of the semiconductor substrate may be silicon carbide. In a semiconductor device having a semiconductor substrate made of silicon carbide, the gate insulation film of the trench gate is often low in quality, thus posing a problem of leakage at the trench gate. For this reason, the technology disclosed herein is useful particularly in the case of a semiconductor substrate made of silicon carbide.

Specific examples of the present teachings has been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:

1. A semiconductor device comprising:
a semiconductor substrate; and
a trench gate extending from a front surface of the semiconductor substrate toward a deep portion of the semiconductor substrate,
wherein the semiconductor substrate comprises:
a drift region of a first conductive type, wherein the drift region is in contact with the trench gate;
a body region of a second conductive type, wherein the body region is disposed above the drift region and is in contact with the trench gate;
a source region of the first conductive type, wherein the source region is disposed above the body region, is in ohmic contact with a source electrode covering the front surface of the semiconductor substrate and is in contact with the trench gate;
a front surface region of the second conductive type, wherein the front surface region is disposed above the source region, is in ohmic contact with the source electrode and is in contact with the trench gate;
a second body region of the second conductive type, wherein the second body region is disposed above the body region, and is in ohmic contact with the source electrode; and
a high concentration front surface region of the second conductive type,
wherein at least a portion of the high concentration front surface region is at the front surface of the semiconductor substrate and an impurity concentration of the high concentration front surface region is higher than an impurity concentration of the front surface region,
wherein in a view along a direction orthogonal to the front surface of the semiconductor substrate, the front surface region is in contact with a side surface of the trench gate that is parallel to a longitudinal direction of the trench gate and the front surface region further surrounds an edge of the trench gate in the longitudinal direction,
wherein in the view along the direction orthogonal to the front surface of the semiconductor substrate, the high concentration front surface region is in contact with an edge side surface of the trench gate that connects between a pair of side surfaces of the trench gate at the edge of the trench gate in the longitudinal direction, wherein the pair of side surfaces is parallel to the longitudinal direction of the trench gate,
wherein the impurity concentration of the front surface region is higher than an impurity concentration of the body region.

2. The semiconductor device according to claim 1, wherein
the trench gate comprises:
a gate insulation film; and
a gate electrode surrounded on side and an edge with the gate insulation film,
wherein a part of the gate insulation film that is in contact with the front surface region and the source region is thicker than another part of the gate insulation film that is in contact with the body region.

3. The semiconductor device according to claim 1, wherein
a material of the semiconductor substrate is silicon carbide.

4. The semiconductor device according to claim 1, further comprising a drain region of the first conductive type disposed on a back layer portion of the semiconductor substrate below the drift region.

5. A semiconductor device comprising:
a semiconductor substrate; and
a trench gate extending from a front surface of the semiconductor substrate toward a deep portion of the semiconductor substrate,
wherein the semiconductor substrate comprises:
a drift region of a first conductive type, wherein the drift region is in contact with the trench gate;
a body region of a second conductive type, wherein the body region is disposed above the drift region and is in contact with the trench gate;
a source region of the first conductive type, wherein the source region is disposed above the body region, is in ohmic contact with a source electrode covering the front surface of the semiconductor substrate and is in contact with the trench gate;

a front surface region of the second conductive type, wherein the front surface region is disposed above the source region, is in ohmic contact with the source electrode and is in contact with the trench gate; and a high concentration front surface region of the second conductive type, wherein at least a portion of the high concentration front surface region is at the front surface of the semiconductor substrate and an impurity concentration of the high concentration front surface region is higher than an impurity concentration of the front surface region, wherein in a view along a direction orthogonal to the front surface of the semiconductor substrate, the front surface region is in contact with a side surface of the trench gate that is parallel to a longitudinal direction of the trench gate and the front surface region further surrounds an edge of the trench gate in the longitudinal direction, wherein in the view along the direction orthogonal to the front surface of the semiconductor substrate, the high concentration front surface region is in contact with an edge side surface of the trench gate that connects between a pair of side surfaces of the trench gate at the edge of the trench gate in the longitudinal direction, wherein the pair of side surfaces is parallel to the longitudinal direction of the trench gate.

6. The semiconductor device according to claim 5, wherein the trench gate comprises:

a gate insulation film; and a gate electrode surrounded on side and an edge with the gate insulation film, wherein a part of the gate insulation film that is in contact with the front surface region and the source region is thicker than another part of the gate insulation film that is in contact with the body region.

7. The semiconductor device according to claim 5, wherein a material of the semiconductor substrate is silicon carbide.

8. The semiconductor device according to claim 5, further comprising a drain region of the first conductive type disposed on a back layer portion of the semiconductor substrate below the drift region.

\* \* \* \* \*